United States Patent
Lin

(10) Patent No.: US 7,665,057 B2
(45) Date of Patent: Feb. 16, 2010

(54) METHOD FOR CALCULATING OPTIMAL LENGTH OF TRACE BETWEEN ADJOINING BENDS AND COMPUTER ACCESSIBLE STORAGE MEDIA

(75) Inventor: Yu-Sen Lin, Taipei (TW)

(73) Assignee: Inventec Corporation, Taipei (TW)

( * ) Notice: Subject to any disclaimer, the term of this patent is extended or adjusted under 35 U.S.C. 154(b) by 247 days.

(21) Appl. No.: 12/030,524

(22) Filed: Feb. 13, 2008

(65) Prior Publication Data

US 2009/0204363 A1 Aug. 13, 2009

(51) Int. Cl.
*G06F 17/50* (2006.01)

(52) U.S. Cl. ............................. 716/15; 716/6; 716/12; 716/13; 716/14; 716/16

(58) Field of Classification Search ............... 716/6, 716/12–16
See application file for complete search history.

(56) References Cited

U.S. PATENT DOCUMENTS

| | | | | |
|---|---|---|---|---|
| 3,765,773 A | * | 10/1973 | Weiner | 356/364 |
| 5,610,833 A | * | 3/1997 | Chang et al. | 716/11 |
| 6,521,467 B2 | * | 2/2003 | Laureanti | 438/12 |
| 6,834,380 B2 | * | 12/2004 | Khazei | 716/10 |
| 7,054,795 B1 | * | 5/2006 | Aves | 703/2 |
| 7,251,791 B2 | * | 7/2007 | Wang | 716/1 |
| 7,397,320 B1 | * | 7/2008 | Bokhari | 333/1 |
| 7,454,300 B2 | * | 11/2008 | Suaya et al. | 702/65 |
| 2003/0088394 A1 | * | 5/2003 | Min et al. | 703/14 |
| 2004/0227580 A1 | * | 11/2004 | Otsuka et al. | 333/4 |
| 2007/0064923 A1 | * | 3/2007 | Schmukler et al. | 379/406.1 |
| 2007/0136706 A1 | * | 6/2007 | Hwang et al. | 716/6 |
| 2007/0171733 A1 | * | 7/2007 | Wood | 365/189.01 |
| 2009/0204934 A1 | * | 8/2009 | Lin | 716/14 |

\* cited by examiner

*Primary Examiner*—Naum B Levin
(74) *Attorney, Agent, or Firm*—J.C. Patents

(57) ABSTRACT

A method for calculating optimal length of trace between adjoining bends is disclosed. First, a rising time Tr of signal of a trace is defined, and a unit transmitting delay $T_D$ of the trace and a transmitting delay $T_{d3}$ of bend in the trace are calculated. A transmitting delay $T_{d2}$ of a trace segment between the adjoining bends in the trace is calculated with Tr and $T_{d3}$. Finally, an equation $L_2 = T_{d2}/T_D$ is calculated for obtaining the optimal length $L_2$ of the trace between a first bend and a second bend.

8 Claims, 10 Drawing Sheets

METHOD FOR CALCULATING OPTIMAL LENGTH OF TRACE BETWEEN ADJOINING BENDS AND COMPUTER ACCESSIBLE STORAGE MEDIA

BACKGROUND OF THE INVENTION

1. Field of the Invention

The present invention generally relates to a circuit layout, in particular, to a method for calculating an optimal length of trace between adjoining bends in the circuit layout.

2. Description of Related Art

In common high speed digital circuits, due to the limitation of layout, two sub circuits or devices must be connected by a bent transmission trace on a single printed circuit board (PCB). FIG. 1A illustrates a layout of right-angle bend. In the right-angle wiring, the effective width of the bend in the transmission trace abruptly becomes wider, and the excess area of the bend may result in a larger equivalent capacitance. Therefore, the bend may cause the discontinuous impedance, and the impedance of the bend is reduced, which incurs a signal reflection phenomenon to some extent.

In order to solve the problem of the capacitive reactance caused by the 90 degrees right angle in the layout, usually the layout area at the bend is reduced. FIG. 1B illustrates a layout of a mitred bend. Through the mitred bend and a suitable degree of chamfering, the stray capacitance can be suppressed.

The layout in FIG. 1A is the most unsatisfactory, and generates the most reflection. The layout in FIG. 1B can suppress the stray capacitance caused by the excess area of the bend, and is a better layout. If the area of the PCB allows, an angle of 90 degrees can be replaced by two bends of 45 degrees. FIG. 1C illustrates a layout of a bend of 45 degrees. As compared with FIGS. 1A and 1B, FIG. 1C is the best layout, and is also most commonly used in the industry, but relatively occupies much area of the PCB. In order to save the area of the PCB, it is better to reduce a length $L_2$ of trace between the two adjoining bends of 45 degrees. However, if the length $L_2$ is too short, a severe signal superposition and reflection phenomenon is caused. Currently, it is hard to determine the shortest length of trace between the adjoining bends.

SUMMARY OF THE INVENTION

Accordingly, the present invention is directed to a method for calculating the optimal length of trace between the adjoining bends, so as to save the area without adversely affecting the signal.

As embodied and broadly described herein, the present invention provides a method for calculating the optimal length of trace between the adjoining bends. The method includes the following steps. A rising time Tr of a signal of a trace is defined. A unit transmitting delay $T_D$ of the trace is determined. A transmitting delay $T_{d3}$ of a first bend in the trace is calculated. A transmitting delay $T_{d2}$ of a trace segment between the first bend and a second bend is calculated with Tr and $T_{d3}$. An equation $L_2=T_{d2}/T_D$ is calculated for obtaining an optimal length $L_2$ of trace between the first bend and the second bend.

The present invention further provides a computer accessible storage media for storing a computer program. The computer program is loaded into a computer system so as to make the computer system to execute the method for calculating the optimal length of trace between the adjoining bends.

In the present invention, the transmitting delay $T_{d2}$ of the trace segment between the adjoining bends in the trace is calculated with the rising time Tr of the signal and the transmitting delay $T_{d3}$ of bends in the trace. Then, $L_2=T_{d2}/T_D$ is calculated for obtaining the optimal length $L_2$ of trace between the adjoining bends. Thus, the area can be saved without adversely affecting the signal (for example, reflection and crosstalk).

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
FIG. 1A illustrates a layout of a right-angle bend.
Figure 1B:
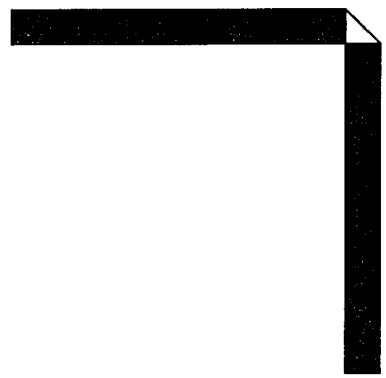
FIG. 1B illustrates a layout of a mitred bend.
Figure 1C:
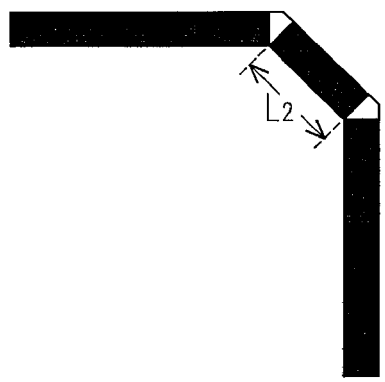
FIG. 1C illustrates a layout of a bend of 45 degrees.

Reference will now be made in detail to the present embodiments of the invention, examples of which are illustrated in the accompanying drawings. Wherever possible, the same reference numbers are used in the drawings and the description to refer to the same or like parts.

In the following, the embodiments are described to illustrate the present invention, such that those of ordinary skill in the art can understand and implement the present invention accordingly. Definitely, the following embodiments can be realized in the form of computer program, and the computer program can be stored in the computer accessible storage media, so as to make the computer to execute the method for calculating the optimal length of trace between the adjoining bends.

Currently, in the layout, the length of trace of the signal is required to be not larger than a maximum length and also not be smaller than a minimum length. Therefore, in layout, usually a serpentine trace (usually 45 degrees or 90 degrees) is used to increase the length, so as to meet the limitation of the minimum length of trace. Besides, the devices are randomly arranged on the PCB, so the circuit wiring cannot go straight from one position to another. Thus, bends (usually 45 degrees or 90 degrees) are usually used to change the direction of the trace to bypass other devices. Therefore, the method for calculating the optimal length of trace between the adjoining bends is illustrated in the following embodiments of the present invention, so as to save the area without adversely affecting the signal (for example, reflection and crosstalk), and also to meet the limitation of the length of trace and the application of changing directions.

For the low speed transmission, the size of the bend is much smaller than the wavelength of the transmission signal. Therefore, the impact of the size of the bend on the signal is quite small, and even is usually neglected. However, when the transmission speed is improved, the high frequency component of the signal is increased. For the high frequency signal, since the wavelength of the signal is shorter, compared with the wavelength of the signal, the size is unneglectable. Viewing from the signal transmission path, the originally uniform transmission trace is formed with a bend having different characteristics from that of the former transmission trace, so the discontinuous structure may result in the signal reflection effect.

Figure 2:
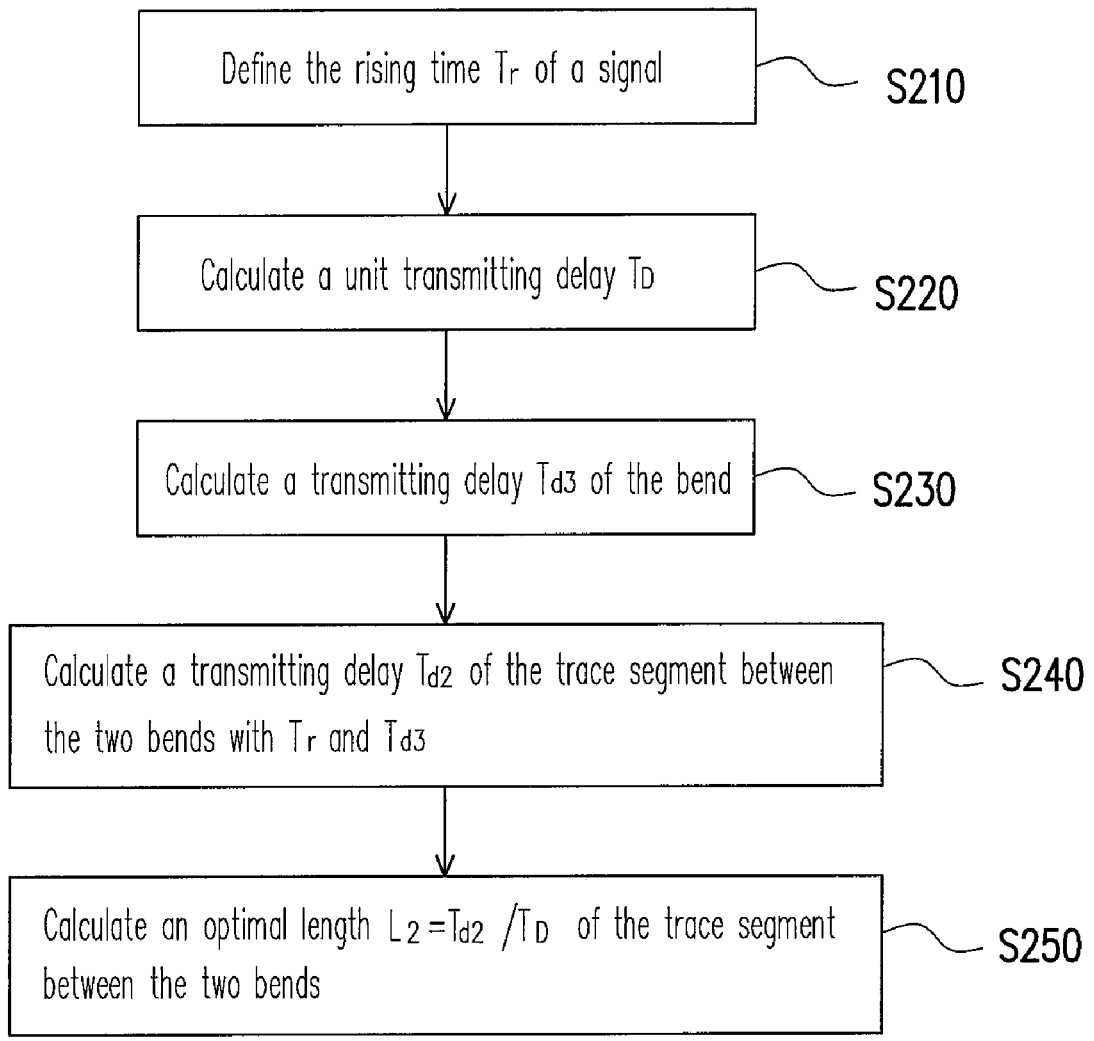
FIG. 2 illustrates the method for calculating the optimal length of trace between the adjoining bends according to an embodiment of the present invention.

FIG. 2 illustrates the method for calculating the optimal length of trace between the adjoining bends according to an embodiment of the present invention. In this embodiment, the trace having the two adjoining bends on the PCB is analyzed, so as to calculate the optimal length of trace between the two adjoining bends. For the convenience of illustration, the adjoining bends are respectively referred to as the first bend and the second bend hereinafter. Here, the first bend and the second bend have the same angle, which may be 45 degrees or other degrees.

Referring to FIG. 2, first, a rising time Tr of a signal of the trace is defined according to a circuit design specification (step S210). Next, a unit transmitting delay $T_D$ of the trace is calculated according to the circuit design specification (step S220). Those skilled in the art can use various current software tools to calculate the unit transmitting delay $T_D$, and one of the software tools will be exemplified in the later part of the present invention. After step S220 is finished, a transmitting delay $T_{d3}$ of the first bend (or the second bend) in the trace is calculated (step S230). Several examples will be described to illustrate the method of calculating the transmitting delay $T_{d3}$ in the later part of the present invention. Those skilled in the art can calculate and obtain the transmitting delay $T_{d3}$ in other manners with reference to the related descriptions.

After the rising time Tr of the signal and the transmitting delay $T_{d3}$ are obtained, a transmitting delay $T_{d2}$ of the trace segment between the first bend and the second bend in the trace is calculated with Tr and $T_{d3}$ (step S240). Finally, an equation $L_2 = T_{d2}/T_D$ is calculated for obtaining an optimal length $L_2$ of trace between the first bend and the second bend (step S250).

Figure 3:
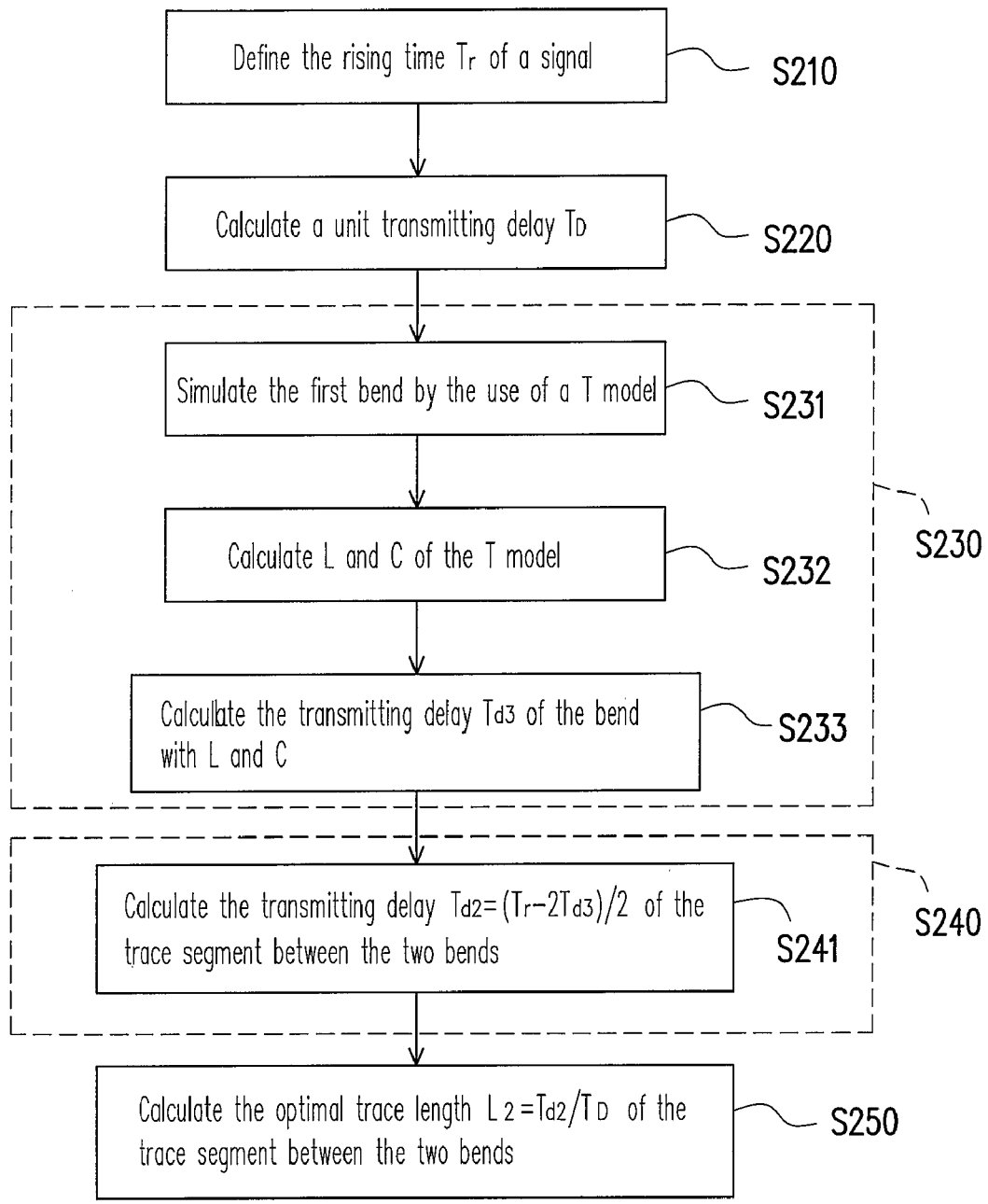
FIG. 3 illustrates a detailed embodiment of the processes in FIG. 2 according to the present invention.

FIG. 3 illustrates a detailed embodiment of the processes in FIG. 2 according to the present invention. First, the rising time Tr of the signal of the trace is defined according to the circuit design specification (step S210). Here, step S230 is first illustrated, which includes sub-steps S231, S232, and S233. In order to analyze the impact of the bends in the trace on the transmission signal, S parameter is calculated by the use of the full-wave simulation software, and the signal reflection and transmission phenomenon may be known through observing the S parameter. However, the above manners are related to the analysis on the frequency domain. In order to observe the impact of the bends in the trace on the time domain, an equivalent circuit model must be obtained from the result on the frequency domain, and then the equivalent circuit model is input into the circuit simulation software, so as to observe the performance on the time domain. For the equivalent circuit model of the bends in the trace, a three-stage T model is used to accurately obtain the equivalent performance of the bends in the trace (step S231).

Figure 4A:
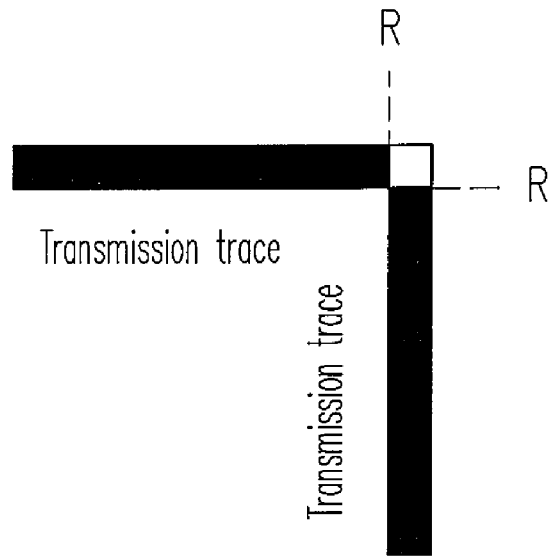
FIG. 4A illustrates a layout of the right-angle bend in the trace according to an embodiment of the present invention.
Figure 4B:
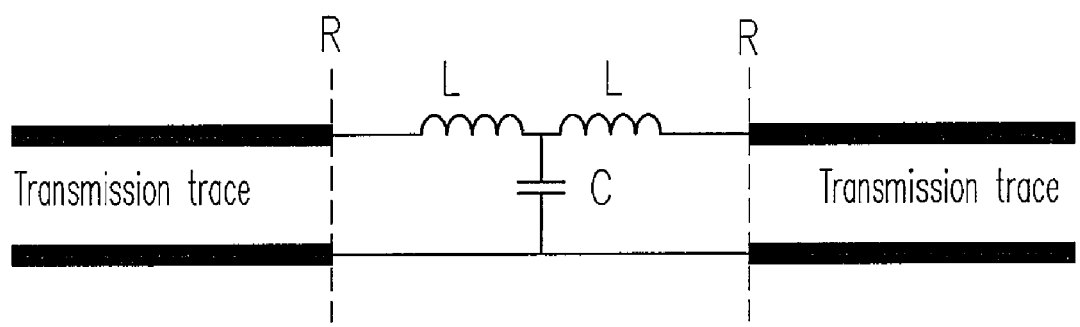
FIG. 4B is an equivalent circuit diagram of the right-angle bend in FIG. 4 according to an embodiment of the present invention.

FIG. 4A illustrates a layout of the right-angle bend in the trace according to an embodiment of the present invention, and FIG. 4B is an equivalent circuit diagram of the right-angle bend in FIG. 4 according to an embodiment of the present invention. Referring to FIGS. 4A and 4B, electromagnetic wave propagates along straight transmission traces of the same width. When the electromagnetic wave enters the bent portion, due to the discontinuous impedance, a part of the signals are reflected, leading to the nonuniformity of the power line, and some additional electric charges are accumulated at the bent portion. That is, a parasitic capacitance effect is generated around the bent portion. Furthermore, the discontinuous current leads to the occurrence of the induction effect. Therefore, in the equivalent circuit as shown in FIG. 4B, two identical inductances L represent the equivalent inductance of the transmission trace (having the same width W) at the two ends of the bend, and a capacitance C represents the capacitance effect generated by the bent portion.

In this embodiment, first, the S parameter of the bend structure is obtained by the use of a numerical analysis, and then is converted into Z parameters of a two-port network, so as to extract the capacitance C and the inductance L in the equivalent circuit model. Next, the simulation software is used to simulate the performance of the single-port bend on the time domain and to analyze the discontinuous effect. The S parameter can be converted to the Z parameters through equations (1), (2), (3), (4).

$$Z_{11} = Z_0 \frac{(1+S_{11}) \cdot (1-S_{22}) + S_{12} \cdot S_{21}}{(1-S_{11}) \cdot (1-S_{22}) - S_{12} \cdot S_{21}} \qquad \text{equation (1)}$$

$$Z_{12} = Z_0 \frac{2 \cdot S_{12}}{(1-S_{11}) \cdot (1-S_{22}) - S_{12} \cdot S_{21}} \qquad \text{equation (2)}$$

$$Z_{21} = Z_0 \frac{2 \cdot S_{21}}{(1-S_{11}) \cdot (1-S_{22}) - S_{12} \cdot S_{21}} \qquad \text{equation (3)}$$

$$Z_{22} = Z_0 \frac{(1-S_{11}) \cdot (1+S_{22}) + S_{12} \cdot S_{21}}{(1-S_{11}) \cdot (1-S_{22}) - S_{12} \cdot S_{21}} \qquad \text{equation (4)}$$

Figure 5A:
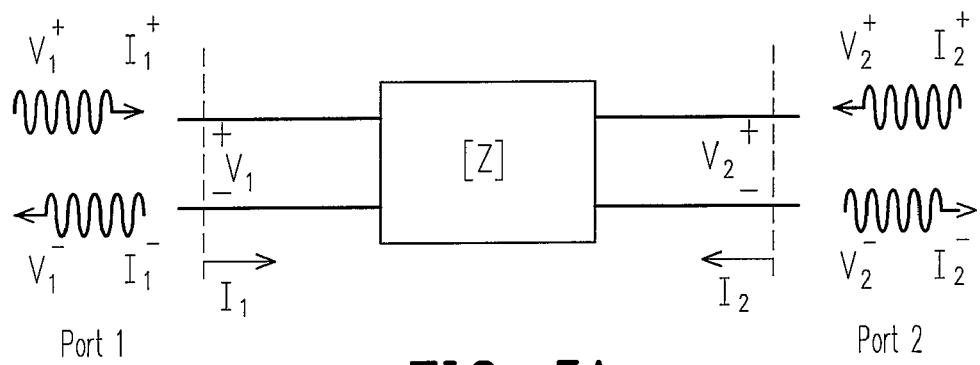
FIG. 5A is an equivalent circuit diagram of a two-port network according to an embodiment of the present invention.

FIG. 5A is an equivalent circuit diagram of a two-port network according to an embodiment of the present invention. Any two-port network (as shown in FIG. 5A) can be described by Z parameters, as shown in an equation (5).

$$V_1 = Z_{11}I_1 + Z_{12}I_2, \text{ and } V_2 = Z_{21}I_1 + Z_{22}I_2 \qquad \text{equation (5)}$$

Currents $I_1$ and $I_2$ are total currents of port 1 and port 2 respectively, and voltages $V_1$ and $V_2$ are total voltages of port 1 and port 2 respectively. The incidence wave and reflection wave must be taken into account at the same time. It is assumed that the voltage and current of the incidence wave and the reflection wave are respectively $(V_n^+, I_n^+)$ and $(V_n^-, I_n^-)$, the total voltage and the total current of the port n are $$V_n = V_n^+ + V_n^- \quad \text{equation (6)}$$

$$V_n = V_n^+ + V_n^- \quad \text{equation (7)}$$

Figure 5B:
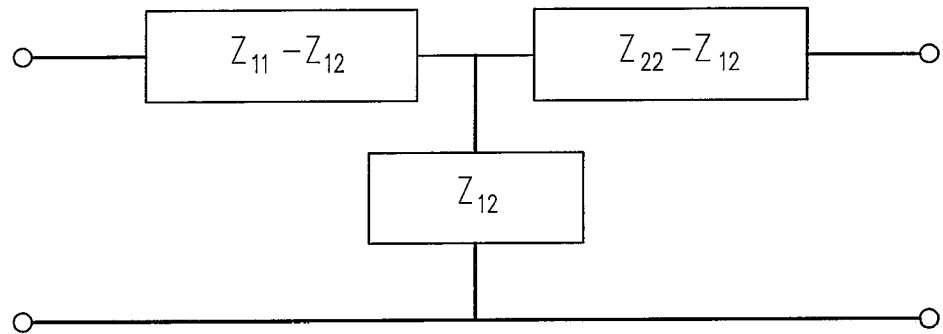
FIG. 5B illustrates an equivalent circuit of the T model of FIG. 5A represented by Z parameters according to an embodiment of the present invention.
Figure 5C:
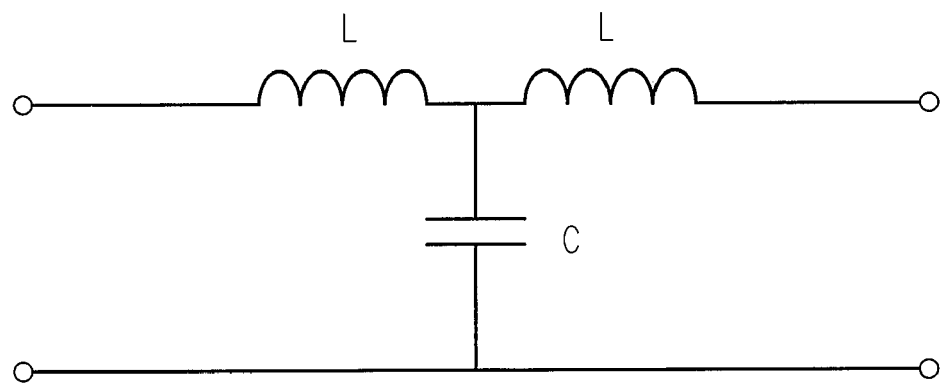
FIG. 5C illustrates an equivalent circuit of the T model according to an embodiment of the present invention.

The transmission trace at the two ends of the bend has the consistent width, and thus has the reciprocal characteristic (i.e. $Z_{12} = Z_{21}$). Therefore, FIG. 5B illustrates an equivalent circuit of the T model of FIG. 5A represented by Z parameters according to an embodiment of the present invention. The loss of the circuit with the frequency in a range of 1 GHz to 10 GHz is not severe. In order to simplify the circuit, in the situation that the loss is not taken into account, the elements of Z parameter matrix are pure imaginary numbers for the lossless network. Therefore, the T model equivalent circuit can be represented by the inductor, the capacitor, and other reactance devices. FIG. 5C illustrates an equivalent circuit of the T model according to an embodiment of the present invention.

The Z parameter matrix of the bend structure in the trace can be obtained by the numerical analysis. The inductance L and the capacitance C of the T model equivalent circuit can be calculated by comparing FIGS. 5B and 5C. However, when the Z parameter matrix is calculated by the use of the full-wave simulation software, the loss of the network is taken into account, so the Z parameter has both a real part and an imaginary part, and the imaginary part is almost hundreds of times of the real part value. Therefore, the effect of the loss is quite small, so in this embodiment emphasizes the variation of the imaginary part caused by the reactance. In this embodiment, the inductance L and the capacitance C of the T model equivalent circuit are obtained through an equation (8) and an equation (9) (step S232 of FIG. 3).

$$L = \frac{\text{Im}(Z_{11}) - \text{Im}(Z_{12})}{\omega} \quad \text{equation (8)}$$

$$C = \frac{-1}{\omega \text{Im}(Z_{12})} \quad \text{equation (9)}$$

Figure 6A:
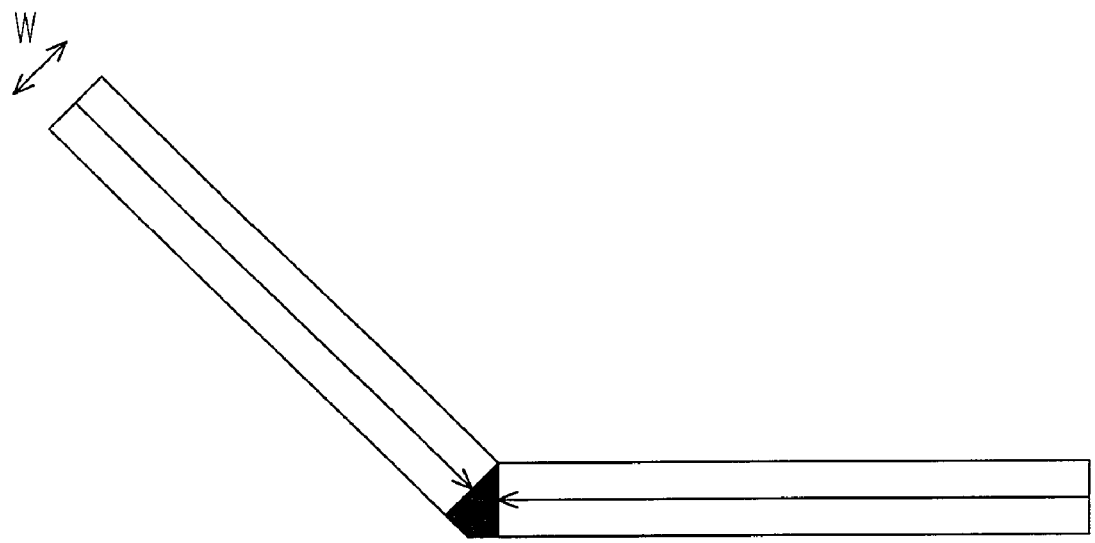
FIG. 6A illustrates a circuit layout of the bend of 45 degrees according to the embodiment.
Figure 6B:
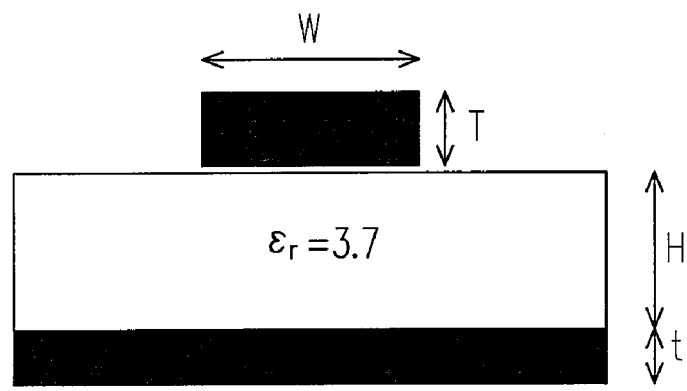
FIG. 6B is a cross-sectional view of FIG. 6A according to the embodiment.

The frequency of this embodiment is in a range of 1 GHz to 10 GHz, so the frequency $\omega$ is set to 5 GHz for calculating the capacitance C and the inductance L. In this manner, the corresponding equivalent circuit models for the bends with different sizes in the trace can be obtained. In this embodiment, the equivalent circuit model for the bend structure of 45 degrees is extracted. FIG. 6A illustrates a circuit layout of the bend of 45 degrees according to the embodiment, and FIG. 6B a cross-sectional view of FIG. 6A according to the embodiment. Referring to FIGS. 6A and 6B, here, it is assumed that in FIG. 6B the width is W=7.8 mil, the trace thickness is T=1.2 mil, the thickness of the lower metal layer is t=1.2 mil, the distance between the trace and the lower metal layer is H=4 mil, and the dielectric coefficient of the PCB is $\epsilon_r$=3.7. For the bend structure of 45 degrees in FIGS. 6A and 6B, the capacitance C=10.76 fF, the inductance L=9.55 pHm, and the impedance of 42.12Ω of the T model equivalent circuit can be obtained.

Figure 7:
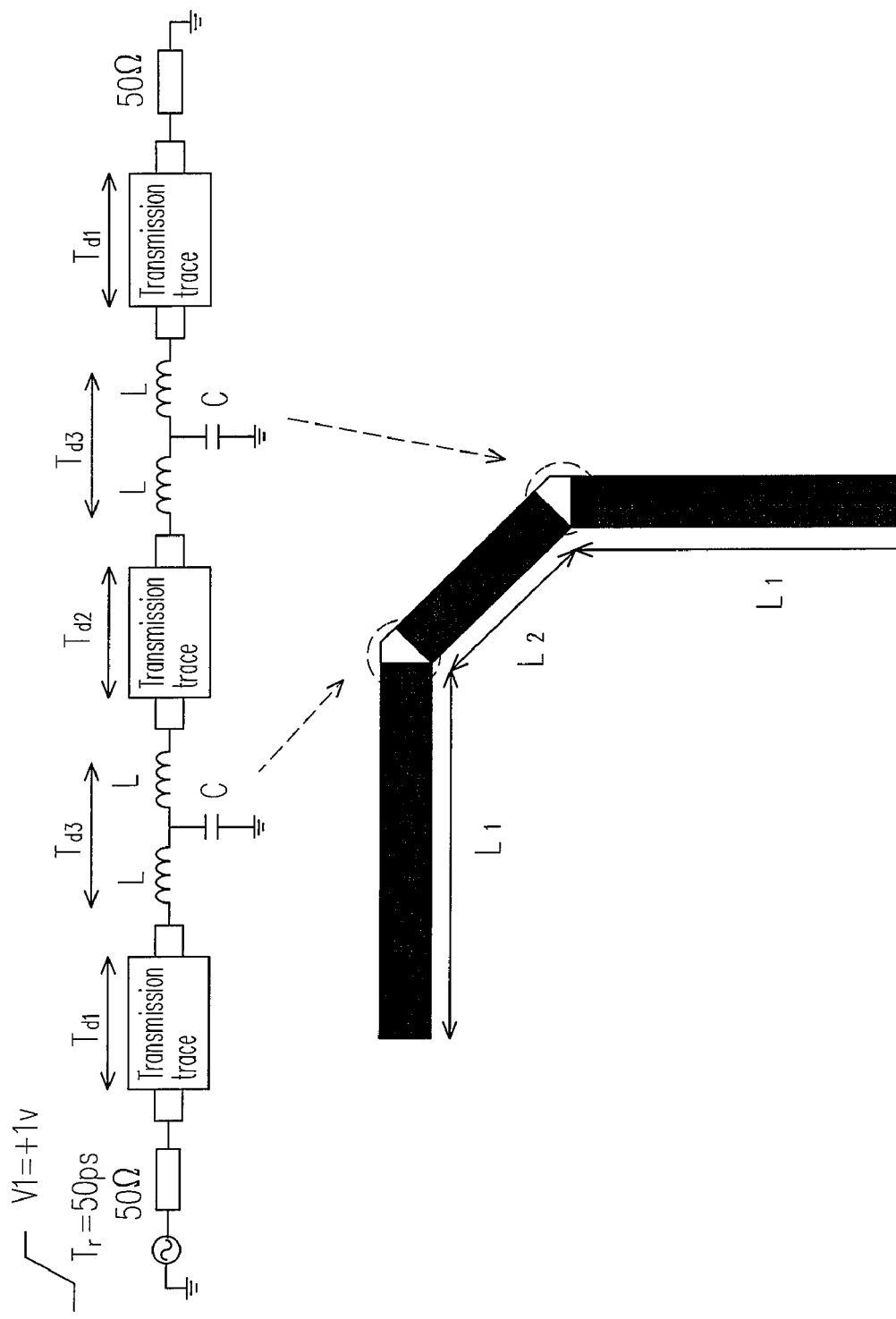
FIG. 7 illustrates a circuit layout having adjoining bends according to an embodiment of the present invention.

FIG. 7 illustrates a circuit layout having adjoining bends according to an embodiment of the present invention. Here, it is assumed that the simulation parameters in FIG. 7 are identical to those of FIGS. 6A and 6B, and $L_1$=1000 mil. In this embodiment, the time domain simulation is performed on the trace of FIG. 7 by the use of the simulation software. In the simulation environment, a voltage amplitude of an input signal source in use is set to be 1 volt, the rising time Tr of the input signal is defined to be 50 ps, and a matching resistor of 50Ω is respectively disposed at the input end and the output end of the transmission trace. After the length of trace of the transmission trace is given, the analysis on the time domain is performed by the use of the T model equivalent circuit of the bend.

Referring to FIGS. 3 and 7, in this embodiment, the unit transmitting delay $T_D$=0.14 ps/mil of the transmission trace of FIG. 7 may be calculated by the use of a POLAR SI9000 simulation software (step S220). Therefore, the transmitting delays of the lengths $L_1$ and $L_2$ of the transmission trace are respectively $$T_{d1} = L_1 \times T_D \text{ and } T_{d2} = L_2 \times T_D \quad \text{equation (10)}$$

Therefore, in step S233 of FIG. 3, the transmitting delay caused by the T model equivalent circuit (i.e. the bend in the trace) is $$T_{d3} = \sqrt{2LC} \quad \text{equation (11)}$$

Figure 8:
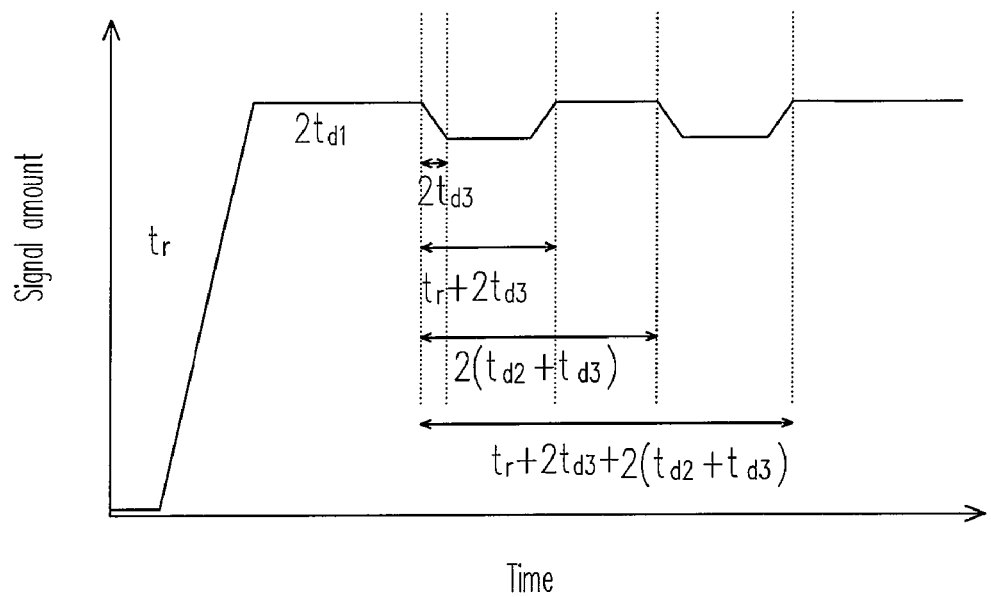
FIG. 8 illustrates capacitive reflection waveform caused by two adjoining bends in the trace in FIG. 7 according to an embodiment of the present invention.
Figure 9:
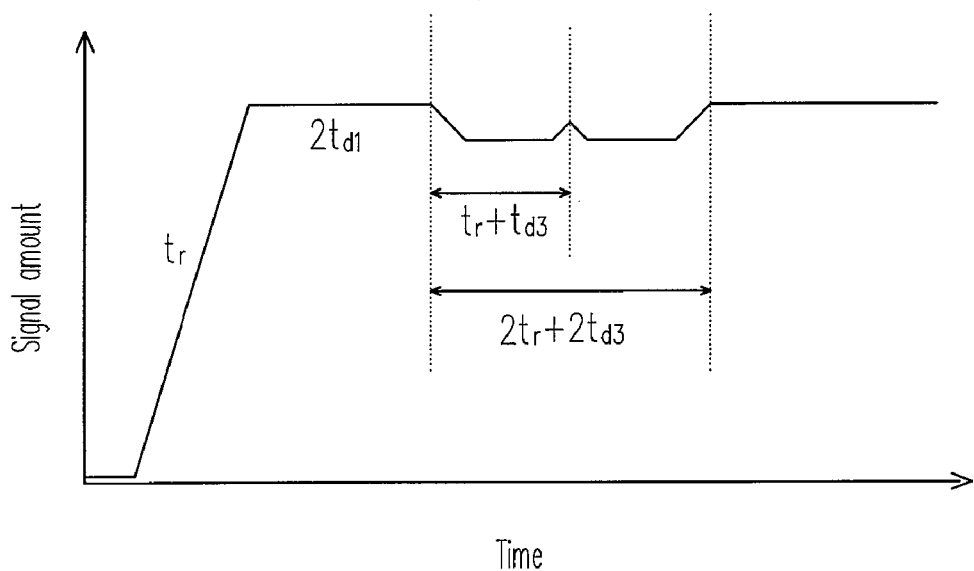
FIG. 9 illustrates a desired capacitive reflection waveform realized by adjusting the length $L_2$ of the trace segment in FIG. 7 according to an embodiment of the present invention.

Here, step S240 of FIG. 3 includes a sub-step S241, which will be illustrated as follows. FIG. 8 illustrates capacitive reflection waveform caused by two adjoining bends in the trace in FIG. 7 according to an embodiment of the present invention. Under the precondition that the original reflection amount is not increased, it is expected to reduce the length $L_2$ of the trace segment between the adjoining bends as much as possible, so as to reduce the resulted time delay. FIG. 9 illustrates a desired capacitive reflection waveform realized by adjusting the length $L_2$ of the trace segment in FIG. 7 according to an embodiment of the present invention. After comparing FIGS. 8 and 9, the equation of the transmitting delay can be obtained $$Tr + 2T_{d3} + 2(T_{d2} + T_{d3}) = 2Tr + 2T_{d3} \quad \text{equation (11)}$$

In step S241 of FIG. 3, a relation between the transmitting delay of the middle length of trace and the rising time Tr of the signal is expressed by $$T_{d2} = (Tr - 2T_{d3})/2 \quad \text{equation (13)}$$

Coefficients of the above equations can be adjusted according to the design requirements. Through the calculation of the simulation software, the characteristic impedance of the transmission trace in FIG. 7 is 50.15Ω, and the impedance of the bend of 45 degrees is 42.13Ω. The rising time of the signal Tr=50 ps, and the transmitting delay caused by the bend of 45 degrees (i.e. the T model equivalent circuit) is $T_{d3}$=$\sqrt{2LC}$=0.4533 ps. Therefore, in step S250 of FIG. 3, the optimal length of trace between the two adjoining bends is $$L_2 = T_{d2}/T_D = \frac{\frac{Tr - 2T_{d3}}{2}}{0.14} = 175.36 \text{ mil} \quad \text{equation (14)}$$

Figure 10:
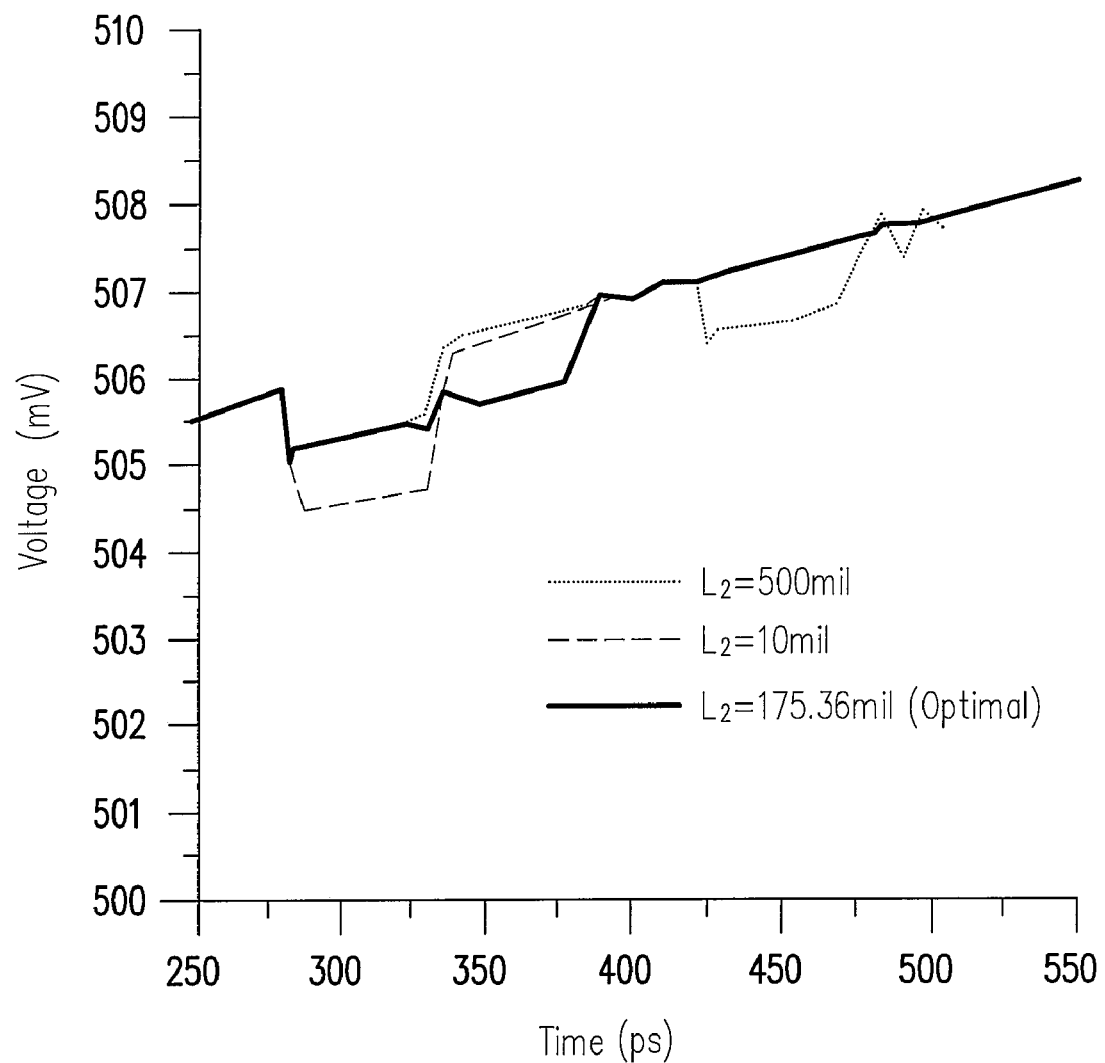
FIG. 10 illustrates a simulation result obtained by using the transmission trace as shown in FIG. 7, respectively setting three different lengths $L_2$=500 mil, 10 mil, and 175.36 mil of the trace, and analyzing and verifying through a simulation software.

FIG. 10 illustrates a simulation result obtained by using the transmission trace as shown in FIG. 7, respectively setting three different lengths $L_2$=500 mil, 10 mil, and 175.36 mil of the trace, and analyzing and verifying through a simulation software. It can be proved by FIG. 10 that the optimal length of trace calculated by the equation (14) is $L_2$=175.36 mil, which has a quite good effect of solving the reflection problem.

Figure 11:
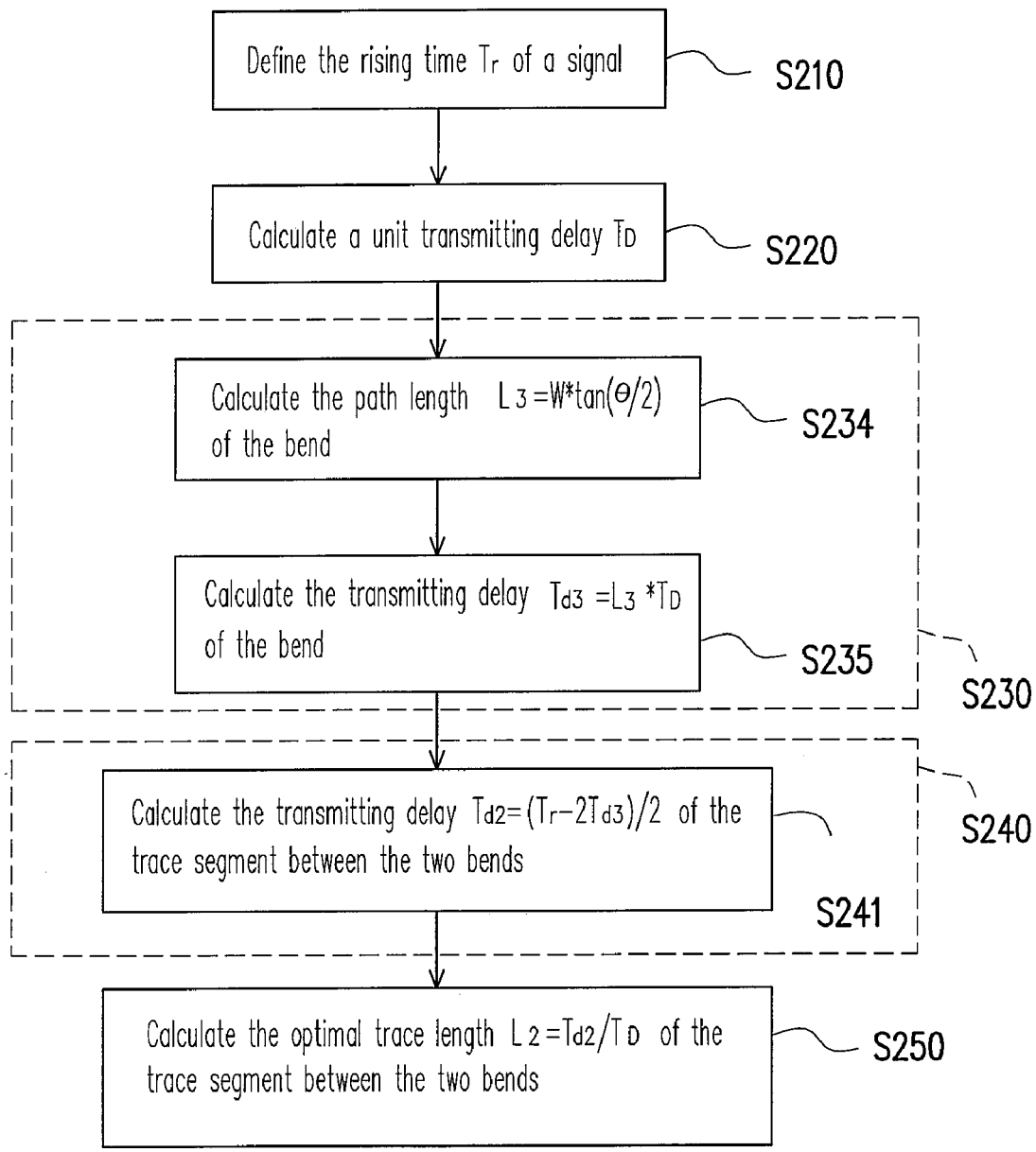
FIG. 11 illustrates another detailed embodiment of the processes in FIG. 2 according to the present invention.

In the above embodiment, the bend is simulated by the T model so as to deduce the transmitting delay $T_{d3}$ of the bend. However, the transmitting delay $T_{d3}$ can also be calculated in other manners. During the numerical analysis, large computer resource and time for simulation are spent. If tens of size structures need to be analyzed, tens of hours must be spent. Each bend structure with a different size when being analyzed needs to be calculated once again. In consideration of saving the calculation resource of the computer and the time for simulation, FIG. 11 illustrates another detailed embodiment of the processes in FIG. 2 according to the present invention. Partial content of FIG. 11 can be implemented with reference to FIG. 3 and will not be described herein again. In this embodiment, in step S230, the transmitting delay $T_{d3}$ of the first bend (or the second bend) is calculated by combining a physical mechanism and a geometric analysis. Step S230 includes sub-steps S234 and S235.

Referring to FIG. 11, first, a path length $L_3$ of the first bend is calculated (sub-step S234). In step S234, the width W of the trace (as shown in FIG. 6A or 7) needs to be first measured, and the angle θ of the first bend (or the second bend) is measured. Next, an equation $L_3=W*\tan(\theta/2)$ is calculated for obtaining the path length $L_3$ of the bend, where $\tan(\theta/2)$ is a tangent function value of (θ/2). After step S234 is finished, step S235 (an equation $T_{d3}=L_3*T_D$ is calculated) is performed for obtaining the transmitting delay $T_{d3}$ of the first bend (or the second bend) in the trace. Therefore, in step S250 of FIG. 11, the optimal length of trace between the two adjoining bends is $$L_2 = T_{d2}/T_D = \frac{\frac{Tr - 2T_{d3}}{2}}{T_D} = \frac{Tr - 2T_D \cdot W \cdot \tan\left(\frac{\theta}{2}\right)}{2 T_D} \quad \text{equation (15)}$$

Here, the simulated structure and environment of FIG. 7 are used, but the T model equivalent circuit is not used. In this embodiment, the transmitting delay $T_{d3}$ of the bend (the first bend and/or the second bend) in FIG. 7 is calculated by a physical geometric analysis. In this simulation environment, the transmitting delay of the bend (the first bend and/or the second bend) is $T_{d3}=W*\tan(\theta/2)*T_D=7.8*\tan(45/2)*0.14=0.4523$ ps. Therefore, the optimal length of trace between the two adjoining bends is $L_2=T_{d2}/T_D=(50-2*0.4523)/(2*0.14)=175.36$ mil. In this embodiment, the transmitting delay $T_{d3}$ of the first bend (or the second bend) is calculated by combining the physical mechanism and the geometric analysis. Therefore, as compared with the previous embodiment, this embodiment can quickly calculate the optimal length between the two adjoining bends without consuming large calculation resource of the computer and time for simulation while maintaining the accuracy.

To sum up, in the above embodiments, the transmitting delay $T_{d2}$ of the trace segment between the two adjoining bends is calculated by using the rising time Tr of the signal and the bend transmitting delay $T_{d3}$ of the bend in the trace. Then, $L_2=T_{d2}/T_D$ is calculated for obtaining the optimal length $L_2$ of trace (the minimum length of trace) between the two adjoining bends. Therefore, the area of the PCB can be saved without adversely affecting the signal (for example, reflection and crosstalk).

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for calculating an optimal length of trace between adjoining bends, comprising:
   using a computer system for:
   defining a rising time Tr of a signal of a trace;
   calculating a unit transmitting delay $T_D$ of the trace;
   calculating a transmitting delay $T_{d3}$ of a first bend in the trace;
   calculating a transmitting delay $T_{d2}$ of a trace segment between the first bend and a second bend with Tr and $T_{d3}$; and
   calculating an equation $L_2=T_{d2}/T_D$ for obtaining an optimal length $L_2$ of trace between the first bend and the second bend.

2. The method for calculating the optimal length of trace between adjoining bends according to claim 1, wherein the first bend and the second bend are bends of 45 degrees.

3. The method for calculating the optimal length of trace between adjoining bends according to claim 1, wherein the step of calculating the transmitting delay $T_{d3}$ of the first bend in the trace comprises:
   simulating the first bend by using a T model;
   calculating an inductance L and a capacitance C of the T model; and
   calculating $T_{d3}=\sqrt{2LC}$ for obtaining the transmitting delay $T_{d3}$ of the first bend.

4. The method for calculating the optimal length of trace between adjoining bends according to claim 3, wherein the step of calculating the inductance L and the capacitance C of the T model comprises:
   calculating parameters $Z_{11}$ and $Z_{12}$ of the first bend;
   calculating an equation $L=[Im(Z_{11})-Im(Z_{12})]/\omega$ for obtaining the inductance L, wherein $Im(Z_{11})$ is an imaginary part of $Z_{11}$, and $Im(Z_{12})$ is an imaginary part of $Z_{12}$; and
   calculating an equation $C=-1/[\omega*Im(Z_{12})]$ for obtaining the capacitance C.

5. The method for calculating the optimal length of trace between adjoining bends according to claim 1, wherein the step of calculating the transmitting delay $T_{d3}$ of the first bend in the trace comprises:
   calculating a path length $L_3$ of the first bend; and
   calculating an equation to $T_{d3}=L_3*T_D$ for obtaining the transmitting delay $T_{d3}$ of the first bend in the trace.

6. The method for calculating the optimal length of trace between adjoining bends according to claim 5, wherein the step of calculating the path length $L_3$ of the first bend comprises:
   measuring a width W of the trace;
   measuring an angle θ of the first bend; and
   calculating an equation $L_3=W*\tan(\theta/2)$ for obtaining the path length $L_3$ of the first bend, wherein $\tan(\theta/2)$ is a tangent of (θ/2).

7. The method for calculating the optimal length of trace between adjoining bends according to claim 1, wherein the step of calculating the transmitting delay $T_{d2}$ comprises:
   calculating an equation $T_{d2}=(Tr-2T_{d3})/2$ for obtaining the transmitting delay $T_{d2}$ of the trace segment between the first bend and the second bend.

8. A computer accessible storage media, for storing a computer program, wherein the computer program is loaded into a computer system so as to make the computer system to execute the method for calculating the optical length of trace between adjoining bends according to claim 1.

* * * * *